US009240552B2

(12) United States Patent
Wong et al.

(10) Patent No.: US 9,240,552 B2
(45) Date of Patent: Jan. 19, 2016

(54) CARBON NANOTUBE SEMICONDUCTOR DEVICES AND DETERMINISTIC NANOFABRICATION METHODS

(75) Inventors: Lawrence D. Wong, Beaverton, OR (US); Scott B. Clendenning, Portland, OR (US); David J. Michalak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,219

(22) PCT Filed: Dec. 27, 2011

(86) PCT No.: PCT/US2011/067401
§ 371 (c)(1),
(2), (4) Date: Jun. 28, 2013

(87) PCT Pub. No.: WO2013/100906
PCT Pub. Date: Jul. 4, 2013

(65) Prior Publication Data
US 2014/0034906 A1 Feb. 6, 2014

(51) Int. Cl.
H01L 51/05 (2006.01)
H01L 29/40 (2006.01)
H01L 51/00 (2006.01)
H01L 21/84 (2006.01)
(Continued)

(52) U.S. Cl.
CPC .......... *H01L 51/0048* (2013.01); *B82B 3/0047* (2013.01); *H01L 21/845* (2013.01); *H01L 27/1211* (2013.01); *H01L 51/0002* (2013.01); *H01L 51/0558* (2013.01)

(58) Field of Classification Search
CPC ............ H01L 51/0048; H01L 51/0558; H01L 51/0002; H01L 27/1211; H01L 21/845

USPC ............................ 257/24, 9, E51.04; 438/478
See application file for complete search history.

(56) References Cited

U.S. PATENT DOCUMENTS

| 7,635,503 B2 | 12/2009 | Dominguez |
| 7,964,490 B2 | 6/2011 | Clendenning |
| 2005/0212014 A1* | 9/2005 | Horibe et al. ................. 257/213 |

(Continued)

FOREIGN PATENT DOCUMENTS

| JP | 2005260113 A | 9/2005 |
| KR | 1020040094179 A | 11/2004 |
| WO | 2013/100906 A1 | 7/2013 |

OTHER PUBLICATIONS

International Search Report and Written Opinion received for International Application No. PCT/US2011/067401, mailed on Nov. 28, 2012, 11 pages.
International Preliminary Report on Patentability received for International Application No. PCT/US2011/067401, mailed on Jul. 10, 2014, 7 pages.

(Continued)

*Primary Examiner* — Julio J Maldonado
*Assistant Examiner* — Moazzam Hossain

(57) ABSTRACT

Embodiments of the invention provide transistor structures and interconnect structures that employ carbon nanotubes (CNTs). Further embodiments of the invention provide methods of fabricating transistor structures and interconnect structures that employ carbon nanotubes. Deterministic nanofabrication techniques according to embodiments of the invention can provide efficient routes for the large-scale manufacture of transistor and interconnect structures for use, for example, in random logic and memory circuit applications.

17 Claims, 11 Drawing Sheets

(51) Int. Cl.
  *H01L 27/12*  (2006.01)
  *B82B 3/00*  (2006.01)

(56) References Cited

U.S. PATENT DOCUMENTS

| | | | |
|---|---|---|---|
| 2007/0122986 A1* | 5/2007 | Sandhu | 438/301 |
| 2008/0150043 A1* | 6/2008 | Cha et al. | 257/401 |
| 2008/0224123 A1* | 9/2008 | Martin et al. | 257/23 |
| 2010/0001260 A1 | 1/2010 | Appenzeller | |
| 2011/0074044 A1* | 3/2011 | Lin et al. | 257/776 |
| 2011/0133165 A1* | 6/2011 | Bangsaruntip et al. | 257/24 |
| 2011/0169059 A1 | 7/2011 | Clendenning | |
| 2012/0001267 A1* | 1/2012 | Lee et al. | 257/369 |
| 2014/0035041 A1* | 2/2014 | Pillarisetty et al. | 257/365 |

OTHER PUBLICATIONS

Chih Ming Hsu et al., "Growth of the large area horizontally-aligned carbon nanotubes by ECT-CVD," Thin Solid Films, 2002, 225-229, 420-421.

B. Kitiyanan et al., "Controlled production of single-wall carbon nanotubes by catalytic decomposition of CO on bimetallic Co-Mo catalysts," Chemical Physics Letters, 2000, 497-503, 317.

Y. Zhang et al., "Imaginig as-grown single-walled carbon nanotubes originated from isolated catalytic nanoparticles," Applied Physics A: Materials Science & Processing, 2002, 325-328, 74.

Andrew S. Cavanagh et al., "Atomic layer deposition on gram quantities of multi-walled carbon nanotubes," Nanotechnology, 2009, 255602, 20.

* cited by examiner

CARBON NANOTUBE SEMICONDUCTOR DEVICES AND DETERMINISTIC NANOFABRICATION METHODS

FIELD OF THE INVENTION

The embodiments of the invention relate to integrated circuit chips, semiconductor devices, transistors, interconnects, and carbon nanotubes.

BACKGROUND INFORMATION

The push toward ever-smaller more highly integrated circuit (IC) and other semiconductor devices places enormous demands on the techniques and materials used to construct the devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example, of 300 mm) and after processing the wafer is diced apart to create individual chips. A 1 cm2 IC chip having feature sizes around of about 90 nm can comprise hundreds of millions of components. Current technologies are pushing feature sizes even smaller than 32 nm. Components of IC chips include, for example, transistors such as CMOS (complementary metal-oxide-semiconductor) devices, capacitive structures, resistive structures, and metal lines that provide electronic connections between components and external devices.

DETAILED DESCRIPTION OF THE INVENTION

Embodiments of the invention provide transistor structures and interconnect structures that employ carbon nanotubes (CNTs). Further embodiments of the invention provide methods of fabricating transistor structures and interconnect structures that employ carbon nanotubes. Deterministic nanofabrication techniques according to embodiments of the invention can provide efficient routes for the large-scale manufacture of transistor and interconnect structures for use, for example, in random logic and memory circuit applications.

Figure 1:
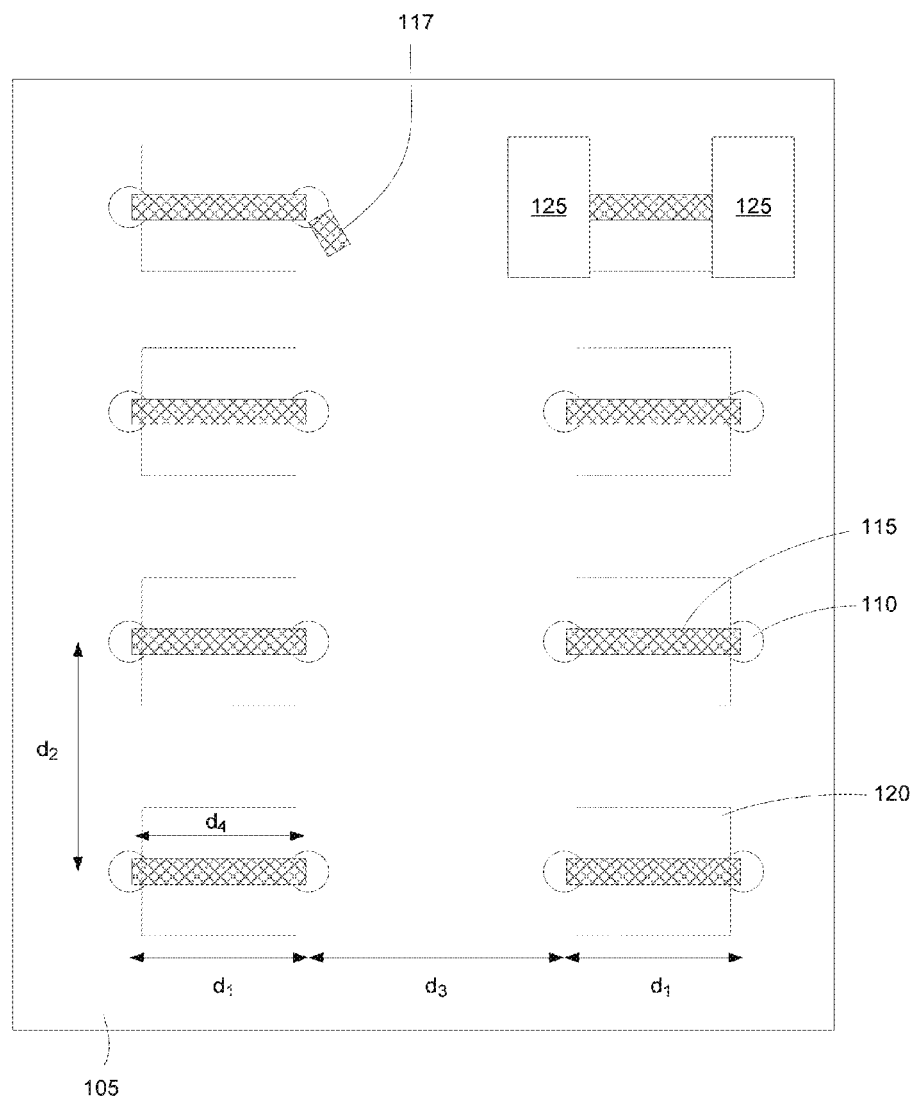
FIG. 1 is a schematic diagram illustrating an array of carbon nanotube transistors.

In the case of transistor devices. FIG. 1 provides an array of structures that have channel regions comprising carbon nanotubes. The components shown in FIG. 1 represent a very small section of a typical IC device which may include many more (or fewer) transistors than the number illustrated in FIG. 1 as well as additional devices, interconnections, and components. In FIG. 1, a substrate 105 houses an array of assembly regions 110 on its surface. Two assembly regions 110 are spanned by one or more carbon nanotubes 115. In embodiments of the invention, the carbon nanotube 115 is a single-walled carbon nanotube. In embodiments of the invention, the carbon nanotube 115 is a semi-conducting carbon nanotube. Assembly regions 110 are regions that can exhibit a strong chemical affinity for an end functionalized carbon nanotube which can cause the attachment of the carbon nanotube to the assembly region. In embodiments of the invention, assembly regions 110 can be comprised, in their entirety or in a region, of polysilicon or doped polysilicon and carbon, nitrogen, and oxygen. Dopants include, for example, boron, phosphorous, antimony, and arsenic. The polysilicon or doped polysilicon regions can also comprise C=O groups on the surface. The polysilicon or doped polysilicon regions comprising carbon, nitrogen, and oxygen can be located at the interface of the polysilicon or doped polysilicon region and the carbon nanotube 115. In further embodiments of the invention, the polysilicon or doped polysilicon can comprise regions comprising carbon, nitrogen, and oxygen and C=O groups at the interface of the polysilicon or doped polysilicon region and the carbon nanotube 115. In further embodiments of the invention, the assembly regions 110 are comprised of a metal or a mixture of metals, M, such as, for example, gold, silver, copper, cobalt, nickel, palladium, and/or platinum. The assembly regions 110 are also comprised, in their entirety or in a region, of for example, MNiS (a mixture of the metal(s), nickel, and sulfur), MCoS (a mixture of the metal(s), cobalt, and sulfur), and/or MN (a mixture of the metal(s) and nitrogen). Optionally, the assembly regions 110 comprise nanocrystals of metal. Depending on the manufacturing process, there may also optionally be one or more randomly distributed (occurring in different orientations, numbers, and/or attachment locations) carbon nanotube fragments 117 associated with one or more assembly regions 110.

The gate electrode can lie within the region 120 enclosed by a dashed line. In an embodiment of the invention, the gate electrode (not shown) lies below the substrate 105 surface and a gate dielectric (not shown) is disposed between the gate electrode and the carbon nanotube 115. The gate dielectric can be on some or all of the substrate surface. In an additional embodiment of the invention, the gate dielectric (not shown) is disposed on carbon nanotubes 115, and the gate electrode (not shown) disposed on the gate dielectric, and the gate region can be described as being all around the carbon nanotube 115. The gate dielectric is between the gate electrode and the carbon nanotube 115. In FIG. 1, the source and drain regions 125 have been illustrated for one transistor structure, but have been omitted for clarity of illustration in the other transistor structures.

In embodiments of the invention, the array of assembly regions 110 in FIG. 1 can be described as columns of assembly regions 110. The distance between a first metal region 110 in a first column and a second proximate metal region 110 in a second proximate column is d1. A carbon nanotube 115 bridges a metal region 110 in the first column and the proximate metal region 110 in the second column. The distance between proximate assembly regions 110 within a column is d2. A third column of assembly regions 110 is separated from the second column by a distance d3. A fourth column of assembly regions 110 is separated from the third column by a distance d1. A carbon nanotube 115 bridges a metal region 110 in the third column and a proximate metal region 110 in the fourth column. Bridging by a carbon nanotube 115 implies that a first end of the carbon nanotube 115 contacts a first metal region 110 and a second end of the carbon nanotube contacts a second metal region 110. The length of the carbon nanotube 115 in FIG. 1 is d4. In embodiments of the invention, the length of the carbon nanotube 115, d4, is approximately (±20%) the same as d1, so that carbon nanotube 115 is capable of spanning between desired proximate assembly regions 110. Other values for the relative lengths of a carbon nanotube 115 and d1 are also possible and depend, in part, on the size of the metal region 110. However, d2 and d3 are not the same as d1 so that the carbon nanotube 115 is not capable of spanning between proximate assembly regions 110 separated by distances d2 and d3. In embodiments of the invention d2>d1 and d3>d1. When d2 is larger than d1 and d3 is larger than d1 undesirable electrical shorting can be avoided. In the case of d2>>d1 and d3>>d1 additional masking steps (e.g., lithography, etching, and mask removal), as described more fully herein, can be eliminated to reduce manufacturing costs and complexity.

Figure 2A:
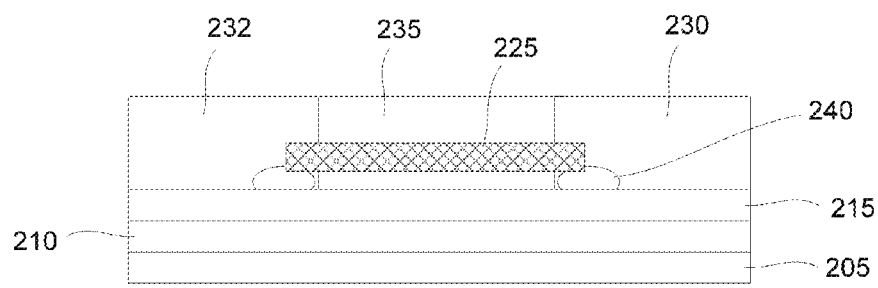
FIGS. 2A-B provide views of transistor structures employing a carbon nanotube in the channel region.
Figure 2B:
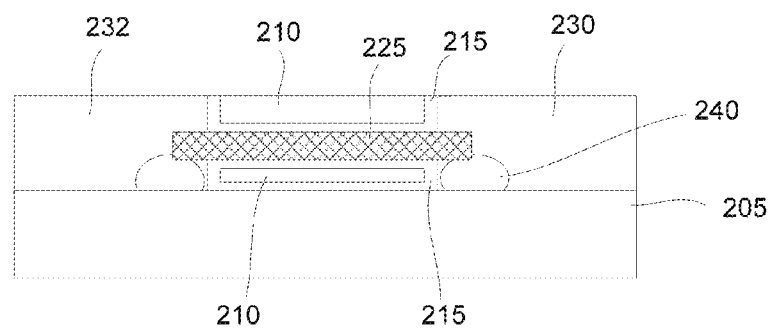

In the case of transistor devices, FIGS. 2A-B provide views of structures employing carbon nanotubes in the channel region. In FIG. 2A, a gate electrode 210 and a gate dielectric 215 layer are disposed on a substrate 205. A carbon nanotube 225 is between source and drain regions 230 and 232. In embodiments of the invention, the region 235 surrounding the carbon nanotube 225 is comprised of a material, such as air or a dielectric material. In further embodiments of the invention, the region 235 is comprised of a photo patternable (or "photo definable") low-k dielectric material. The region 235 can be partially comprised of or comprised in its entirety of a photo patternable low-k dielectric material. The device of FIG. 2A can also function as a switch or interconnect.

In FIG. 2B, a carbon nanotube 225 is between source and drain regions 230 and 232. A gate dielectric layer 215 is disposed on carbon nanotube 225 and a gate electrode 210 is disposed on the gate dielectric layer 215. The gate dielectric layer 215 wraps around the carbon nanotube 225. The gate electrode 210 wraps around the gate dielectric layer 215. In an embodiment of the invention, the gate dielectric layer 215 is comprised of a high-k dielectric material. Wrap-around gate materials can be deposited, for example, by atomic layer deposition (ADL) processes. In embodiments of the invention, in FIGS. 2A-B, the carbon nanotube 225 is a semiconducting carbon nanotube. In embodiments of the invention, the carbon nanotube 225 is a single-walled carbon nanotube. In FIGS. 2A-B, the ends of the carbon nanotube 225 contact assembly regions 240. Assembly regions 240 are regions that can exhibit a strong chemical affinity for an end functionalized carbon nanotube which can cause the attachment of the carbon nanotube to the assembly region. In embodiments of the invention, assembly regions 240 can be comprised, in their entirety or in a region, of polysilicon or doped polysilicon and carbon, nitrogen, and oxygen. Dopants include, for example, boron, phosphorous, antimony, and arsenic. The polysilicon or doped polysilicon regions can also comprise C=O groups on the surface. The polysilicon or doped polysilicon regions comprising carbon, nitrogen, and oxygen can be located at the interface of the polysilicon or doped polysilicon region and the carbon nanotube 225. In further embodiments of the invention, the polysilicon or doped polysilicon can comprise regions comprising carbon, nitrogen, and oxygen and C=O groups at the interface of the polysilicon or doped polysilicon region and the carbon nanotube 225. In further embodiments of the invention, the assembly regions 240 are comprised of a metal or mixture of metals, M, such as, for example, gold, silver, copper, cobalt, nickel, palladium, and/or platinum. The assembly regions 240 are also comprised, in their entirety or in a region, of for example, MNiS (a mixture of the metal, nickel, and sulfur), MCoS (a mixture of the metal, cobalt, and sulfur), and/or MN (a mixture of the metal and nitrogen). Optionally, the assembly regions 240 comprise nanocrystals of metal.

Gate dielectric materials include, for example, insulating materials, such as, silicon dioxide ($SiO_2$), oxynitride ($SiO_xN_y$), silicon nitride ($Si_3N_4$), and/or a high-k dielectric materials. In general, a high-k dielectric is a dielectric material having a dielectric constant greater than that of $SiO_2$. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art.

Gate electrode materials include, for example, materials such as Ti, W, Ta, Al, and alloys thereof, and alloys with rare earth elements, such as Er, Dy or noble metals such as Pt, Ru, Pd, and Co, Ir, and alloys thereof, and nitrides such as TaN, TiN, and VN. Materials for sources and/or drains include, for example, Si, carbon doped Si, and phosphorus doped Si, SiGe, Ge, and semiconductors (i.e., compound semiconductor materials comprising elements from Groups III and V of the periodic table).

Figure 3:
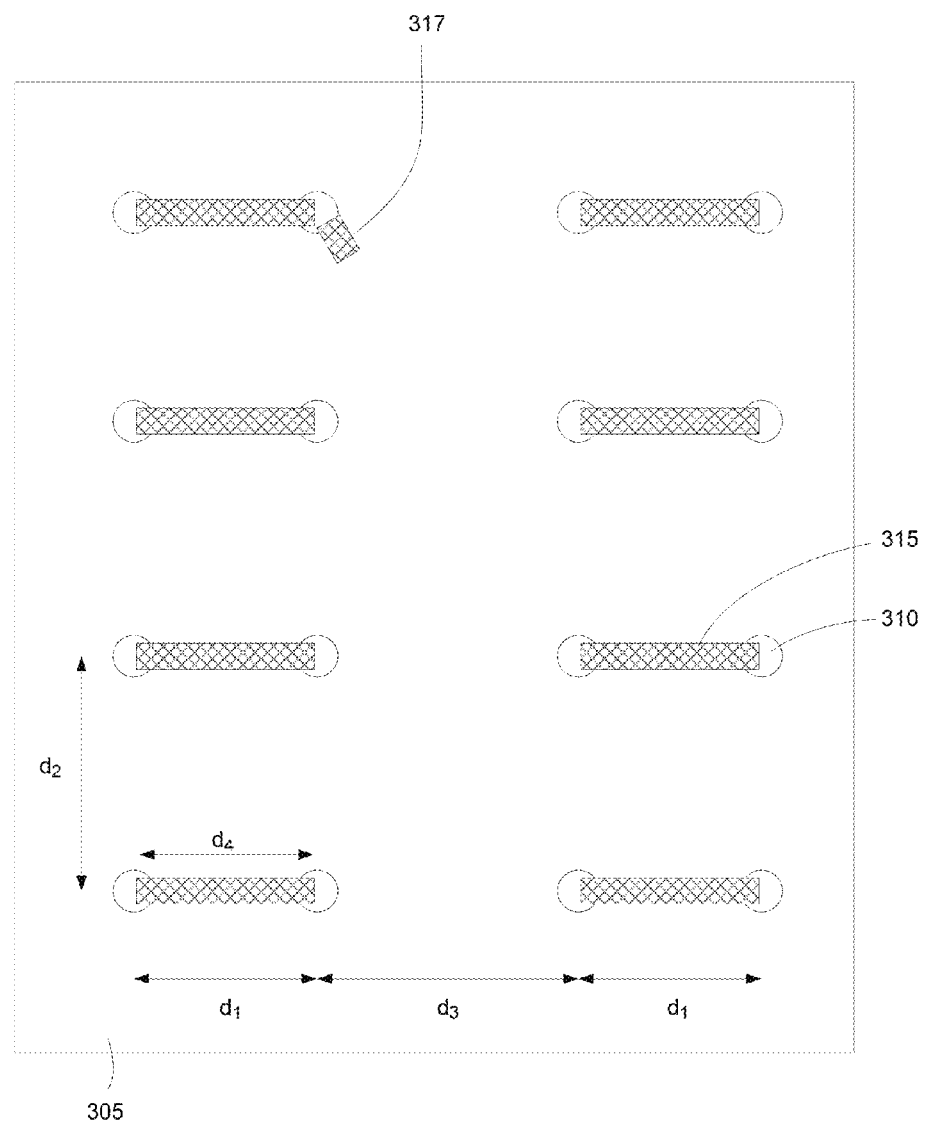
FIG. 3 is a schematic diagram illustrating an array of carbon nanotube interconnect structures.

FIG. 3 illustrates an array of carbon nanotube interconnect structures. The components shown in FIG. 3 represent a very small section of a typical IC device which may include many more (or fewer) transistors than the number illustrated in FIG. 3 as well as additional devices, interconnections, and components. In FIG. 3, a substrate 305 houses an array of assembly regions 310 on its surface. Two assembly regions 310 are spanned by one or more carbon nanotubes 315. Assembly regions 310 are regions that can exhibit a strong chemical affinity for an end functionalized carbon nanotube which can cause the attachment of the carbon nanotube to the assembly region. In embodiments of the invention, the carbon nanotube 315 is a single-walled carbon nanotube. In embodiments of the invention, the carbon nanotube 315 is a metallic (conducting) carbon nanotube. In embodiments of the invention, assembly regions 310 can be comprised, in their entirety or in a region, of polysilicon or doped polysilicon and carbon, nitrogen, and oxygen. Dopants include, for example, boron, phosphorous, antimony, and arsenic. The polysilicon or doped polysilicon regions can also comprise C=O groups on the surface. The polysilicon or doped polysilicon regions comprising carbon, nitrogen, and oxygen can be located at the interface of the polysilicon or doped polysilicon region and the carbon nanotube 315. In further embodiments of the invention, the polysilicon or doped polysilicon can comprise regions comprising carbon, nitrogen, and oxygen and C=O groups at the interface of the polysilicon or doped polysilicon region and the carbon nanotube 115. In further embodiments of the invention, the assembly regions 310 are comprised of a metal or mixture of metals, M, such as, for example, gold, silver, copper, cobalt, nickel, palladium, platinum, and/or alloys thereof. The assembly regions 310 can also be comprised, in their entirety or in a region, of MNiS (a mixture of the metal, nickel, and sulfur), MCoS (a mixture of the metal, cobalt, and sulfur), and/or MN (a mixture of the metal and nitrogen). Optionally, the assembly regions 310 comprise nanocrystals of metal. Depending on the manufacturing process, there may also optionally be one or more randomly distributed (occurring in different orientations, numbers, and/ or attachment locations) carbon nanotube fragments 317 associated with one or more assembly regions 310.

In embodiments of the invention, the array of assembly regions 310 in FIG. 3 can be described as columns of assembly regions 310. The distance between a first metal region 310 in a first column and a second proximate metal region 310 in a second proximate column is d1. A carbon nanotube 315 spans a metal region 310 in the first column and the proximate metal region 310 in the second column. The distance between proximate assembly regions 310 within a column is d2. A third column of assembly regions 310 is separated from the second column by a distance d3. A fourth column of assembly regions 310 is separated from the third column by a distance d1. A carbon nanotube 315 spans a metal region 310 in the third column and a proximate metal region 310 in the fourth column. Spanning by a carbon nanotube 315 implies that a first end of the carbon nanotube 315 contacts a first metal region 310 and a second end of the carbon nanotube contacts a second metal region 310. The length of the carbon nanotube 315 in FIG. 3 is d4. In embodiments of the invention, the length of the carbon nanotube 315, d4, is approximately (±20%) the same as d1, so that a carbon nanotube 315 is capable of spanning between desired proximate assembly regions 310. Other values for the relative lengths of a carbon nanotube 315 and d1 are also possible and depend, in part, on the size of the metal region 310. However, d2 and d3 are not the same as d1 so that the carbon nanotube 315 is not capable of spanning between proximate assembly regions 315 separated by distances d2 and d3, in embodiments of the invention d2>d1 and d3>d1. When d2 is larger than d1 and d3 is larger than d1 undesirable electrical shorting can be avoided. In the case of d2>>d1 and d3>>d1 additional masking steps (e.g., lithography, etching, and mask removal), as described more fully herein, can be eliminated to reduce manufacturing costs and complexity.

Figure 4:
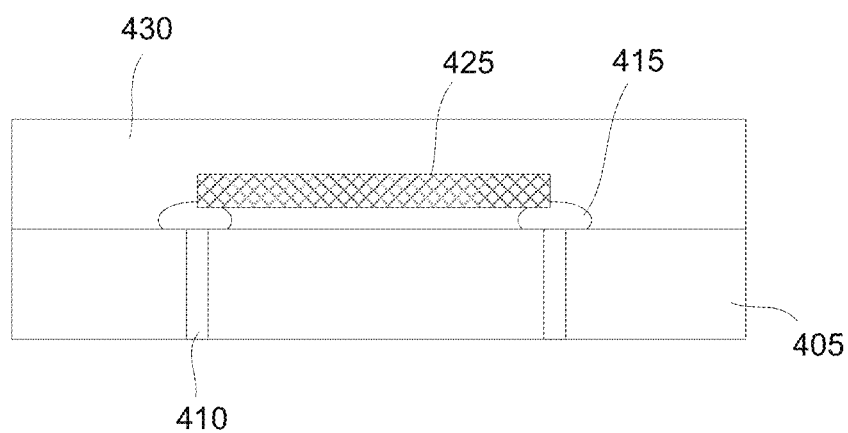
FIG. 4 provides an additional view of an interconnect structure employing carbon nanotubes.

FIG. 4 illustrates a carbon nanotube interconnect structure. In FIG. 4, a substrate 405 comprises conducting vias 410. The substrate 405 is comprised of a dielectric material. In embodiments of the invention, conducting vias 410 are comprised of a metal, such as copper. Two assembly regions 415 are spanned by one or more carbon nanotubes 425. In embodiments of the invention, the carbon nanotube 425 is a single-walled carbon nanotube. In embodiments of the invention, the carbon nanotube 425 is a metallic carbon nanotube. Assembly regions 415 are regions that can exhibit a strong chemical affinity for an end functionalized carbon nanotube which can cause the attachment of the carbon nanotube to the assembly region. In embodiments of the invention, assembly regions 415 can be comprised, in their entirety or in a region, of polysilicon or doped polysilicon and carbon, nitrogen, and oxygen. Dopants include, for example, boron, phosphorous, antimony, and arsenic. The polysilicon or doped polysilicon regions can also comprise C=O groups on the surface. The polysilicon or doped polysilicon regions comprising carbon, nitrogen, and oxygen can be located at the interface of the polysilicon or doped polysilicon region and the carbon nanotube 425. In further embodiments of the invention, the polysilicon or doped polysilicon can comprise regions comprising carbon, nitrogen, and oxygen and C=O groups at the interface of the polysilicon or doped polysilicon region and the carbon nanotube 115. In further embodiments of the invention, the assembly regions 415 are comprised of a metal or a mixture of metals, M, such as, for example, gold, silver, copper, cobalt, nickel, palladium, platinum or alloy materials thereof. The assembly regions 415 are also comprised, in their entirety or in a region, of for example, MNiS (a mixture of the metal, nickel, and sulfur), MCoS (a mixture of the metal, cobalt, and sulfur), and/or MN (a mixture of the metal and nitrogen). Optionally, the assembly regions 415 comprise nanocrystals of metal. The carbon nanotube 425 interconnect can be covered in a dielectric material 430. The dielectric material 430 can be a material such as silicon dioxide, a carbon-doped oxide (CDO), a fluorocarbon material (CFx), a hydrocarbon material (CHx), a carbosilane material, an oxycarbosilane material, a silicon carbide, or a silicon nitride (any of which may be porous). In embodiments of the invention, a region of the dielectric material 430 proximate to the carbon nanotube 415 is comprised of a photo patternable (low-k) dielectric material.

Figure 5A:
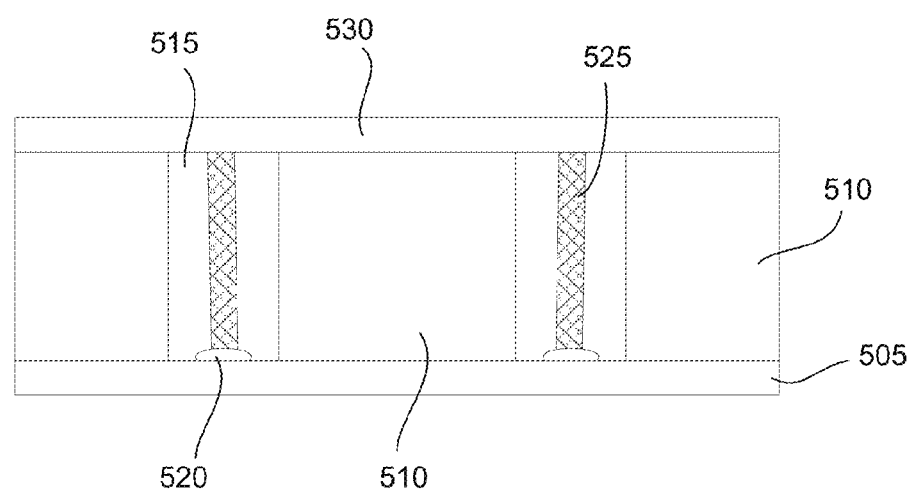
FIGS. 5A-D illustrate interconnect structures comprising carbon nanotubes.

FIGS. 5A-D illustrate carbon nanotube semiconductor interconnect contact/via structures. In FIG. 5A an insulating layer 510 is disposed on substrate 505. Dielectric layer 510 comprises vias 515. In embodiments of the invention, the dielectric layer 510 is comprised of a negative photo-definable spin-on photoresist. Other dielectric materials are also possible, such as, for example, silicon dioxide, a carbon-doped oxide (CDO), a fluorocarbon material (CFx), a hydrocarbon material (CHx), a carbosilane material, an oxycarbosilane materials, a silicon carbide, or a silicon nitride (any of which may be porous). Assembly regions 520 are disposed at an end of the via 515 on the substrate 505. Assembly regions 520 are regions that can exhibit a strong chemical affinity for an end functionalized carbon nanotube which can cause the attachment of the carbon nanotube to the assembly region. In embodiments of the invention, assembly regions 520 can be comprised, in their entirety or in a region, of polysilicon or doped polysilicon and carbon, nitrogen, and oxygen. Dopants include, for example, boron, phosphorous, antimony, and arsenic. The polysilicon or doped polysilicon regions can also comprise C=O groups on the surface. The polysilicon or doped polysilicon regions comprising carbon, nitrogen, and oxygen can be located at the interface of the polysilicon or doped polysilicon region and the carbon nanotube 525. In further embodiments of the invention, the polysilicon or doped polysilicon can comprise regions comprising carbon, nitrogen, and oxygen and C=O groups at the interface of the polysilicon or doped polysilicon region and the carbon nanotube 115. In further embodiments of the invention, the assembly regions 520 are comprised of a metal or mixture of metals, M, such as, for example, gold, silver, cobalt, palladium, platinum, copper, nickel, or alloy materials thereof. The assembly regions 520 are also comprised, in their entirety or in a region, of for example, MNiS (a mixture of the metal, nickel, and sulfur), MCoS (a mixture of the metal, cobalt, and sulfur), and/or MN (a mixture of the metal and nitrogen). Optionally, the assembly regions 520 comprise nanocrystals of metal. One or more carbon nanotubes 525 are located in the via 515 and span the distance between the metal region 520 and an electrical interconnect 530 so that one end of a carbon nanotube 525 contacts the metal region 520 and the other end contacts the electrical interconnect 530. Electrical interconnect 530 can be a trench. Inside the via 515, there can be one carbon nanotube 525 or a bundle of carbon nanotubes 525. In embodiments of the invention the bundle can comprise, for example, from 2 to 2000 carbon nanotubes 525. In embodiments of the invention, the carbon nanotube 525 is a simile-walled carbon nanotube. In embodiments of the invention, the carbon nanotube 525 is a metallic carbon nanotube (a conducting carbon nanotube). The electrical interconnect 530 is comprised, for example, of a metal, such as, copper, aluminum, silver, and/or gold. In embodiments of the invention, the electrical interconnect is comprised of copper.

Figure 5B:
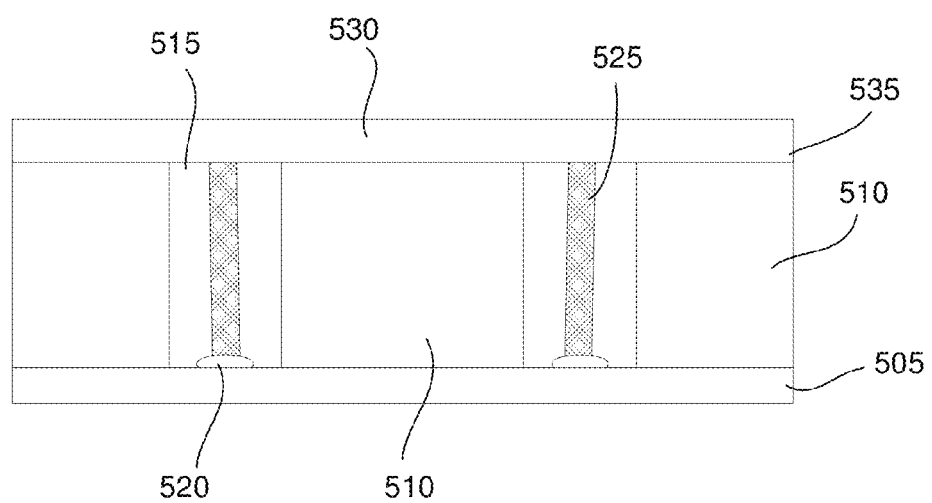

Elements of the semiconductor interconnect structures of FIG. 5B are similar to those shown and described with respect to FIG. 5A. However, FIG. 5B includes an additional liner layer 535 between the electrical interconnect 530 and the dielectric layer 510. Although not shown in FIG. 5B, the liner layer 535 can also be recessed into the via 515. In embodiments of the invention, the liner layer 535 comprises Ta, TaN, Ti, TiN, WN, VN, Co, manganese oxide, manganese silicate, Ru doped with P, and/or Ru doped with B. Other materials are also possible. In embodiments of the invention, the liner layer can serve as an electromigration barrier.

Figure 5C:
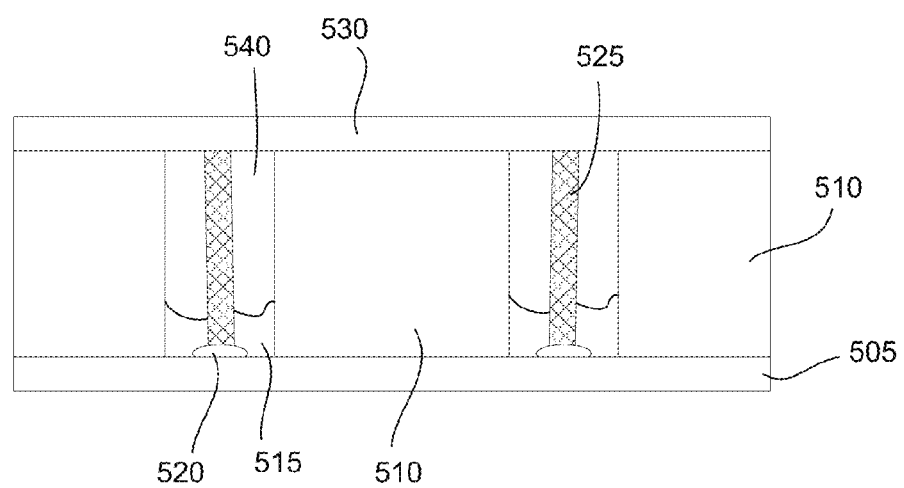
Figure 5D:
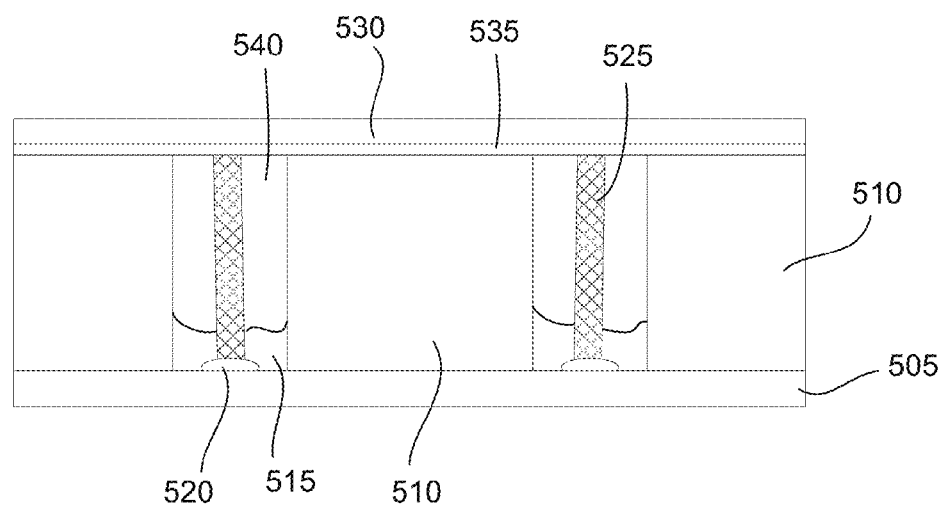

Elements of the semiconductor interconnect structures of FIG. 5C are similar to those shown and described with respect to FIG. 5A. However, FIG. 5C includes a dielectric fill layer 540 in via 515. The dielectric fill layer 540 can partially or fully fill the via 515. In embodiments of the invention, the dielectric fill layer 540 comprises a low-k material, such as a spin-on low-k dielectric or a photodefinable low-k dielectric, although other materials are also possible. Elements of the semiconductor interconnect structures of FIG. 5D are similar to those of FIG. 5C. However, FIG. 5D includes an additional liner layer 535 between the electrical interconnect 530 and the dielectric layer 510 and the dielectric fill layer 540. In embodiments of the invention, the liner layer 535 comprises Ta, TaN, Ti, TiN, WN, VN, Co, manganese oxide, manganese silicate, Ru doped with P, and/or Ru doped with B. Other materials are also possible. In embodiments of the invention, the liner layer can serve as an electromigration barrier.

The substrates (or lower layers) 505 can comprise other vias, lines, interconnects, and/or devices (not shown) in electrical contact with the assembly regions 520 and other devices and/or structures that are part of the monolithic IC chip which the interconnect structures of FIGS. 5A-D are a part.

Figure 6:
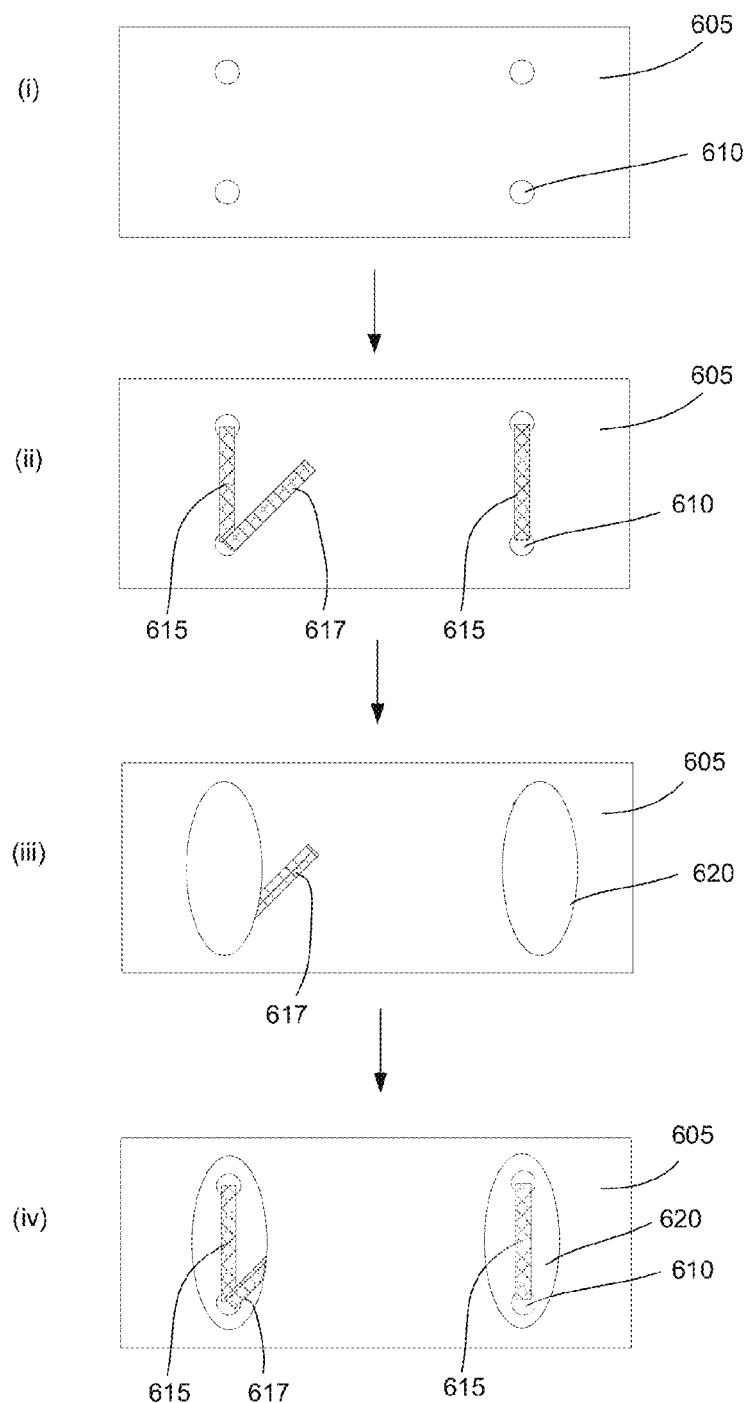
FIG. 6 illustrates a method for the deterministic nanofabrication of transistor structures.

FIG. 6 illustrates a method for forming an array of structures that have regions comprising carbon nanotubes. In FIG. 6, Structure (i), a substrate 605 comprises an array of assembly regions 610. The substrate 605 can comprise gate dielectric and gate electrode regions, such as, for example those shown with respect to FIGS. 1 and 2. The array of assembly regions 610 can be created, for example, through patterning using top down lithography techniques or bottom-up self-assembly techniques. The array of assembly regions 610 have a geometric layout on the substrate 605 such that carbon nanotubes having a monodisperse length can only bridge two assembly regions 610 between which a connection is desired, such as, for example, the layouts described with respect to FIGS. 1 and 3. The assembly regions 610 are comprised of a material that is capable of or a material that is chemically functionalized to be capable of causing the assembly regions 610 to direct the assembly of spanning carbon nanotubes 615. The assembly regions 610 can be comprised of a metal or mixture of metals, M, such as, for example, gold, silver, copper, cobalt, nickel, palladium, platinum, or alloy materials thereof. The assembly regions 610 can alternatively be comprised of polysilicon or doped polysilicon that is surface functionalized with, for example, carboxylic acid groups. Dopants include, for example, boron, phosphorous, antimony, and arsenic. The carbon nanotubes 615 exhibit monodisperse lengths and are chemically end functionalized in a manner that guides assembly of the array of structures comprising bridged carbon nanotubes 615 on substrate 605. Semiconducting carbon nanotubes 615 having desired monodisperse lengths can be prepared using selective growth techniques or post-synthetic separation techniques. Post-synthetic separation techniques include purification techniques such as density gradient ultracentrifugation. Pentagonal and hexagonal defects in single-walled carbon nanotube structures localized primarily on the ends of the tubes can serve as nucleation sites for selective area atomic layer deposition (ALD) of functionalization materials. For example, atomic layer deposition of $Ni_3S_2$, $NiS_2$, and/or $Co_9S_8$ onto the end regions of a carbon nanotube can be used to direct binding of the carbon nanotube ends to assembly regions comprised of late transition metals, such as, Ag, Au, and/or Cu. Atomic layer deposition can deposit a few layers of a material such as $Ni_3S_2$, $NiS_2$, and/or $Co_9S_8$ onto the ends of the carbon nanotubes. Atomic layer deposition of carbon nanotubes can be carried out in a rotary ALD reactor. Alternately, carbon nanotubes can be selectively end functionalized using vapor phase or solution phase reactions to end functionalize the carbon nanotubes with amine groups. Amine terminated carbon nanotubes can be used to direct binding to the carboxylic acid groups of the polysilicon or doped polysilicon assembly regions. Amine functionalization on the end regions of a carbon nanotube can also be used to direct binding of the carbon nanotube ends to assembly regions comprised of late transition metals. Structure (ii) of FIG. 6 is formed by, for example, applying end functionalized carbon nanotubes having monodisperse lengths dispersed in a solvent or mixture of solvents to the surface of substrate 605. Optionally, the solvent or mixture of solvents comprises surfactants. Also, optionally, the solution comprising dispersed end functionalized carbon nanotubes can be agitated to facilitate the fluidic self-assembly process in which the functionalized ends of the carbon nanotubes attach to the assembly regions 610. The carbon nanotubes can form useful structures in which they bridge two proximate assembly regions 610 and can form non-functional structures (carbon nanotube 117) in which one or no ends are in contact with assembly regions 610. Following fluidic self-assembly, the substrate 605 is rinsed to remove the majority of carbon nanotubes not interacting with assembly regions 610. The carbon nanotubes 615 can be optionally sintered in place by using a thermal annealing process. In embodiments of the invention, the thermal anneal occurs at less than 450° C. The annealing process can optionally be facilitated by the use of UV (ultra violet) or other electromagnetic radiation.

FIG. 6, Structure (iii) is formed by depositing a patternable dielectric material 620, such as a photo patternable low-k dielectric material, on the surface of the substrate 605, patterning the dielectric material 620, and partially removing dielectric material 620 according to the pattern. In embodiments of the invention, the patternable dielectric material 620 can also be a chemical vapor deposition (CVD), plasma enhanced chemical vapor deposition (PECVD), high density plasma chemical vapor deposition (HDP CVD), or spin on material, such as a photoresist, a other curable material with a composition sufficiently different from that of the carbon nanotubes such that exposed carbon nanotubes or carbon nanotube segments 617 can be removed in the presence of dielectric material 620, or other curable material with a composition sufficiently different from that of the carbon nanotubes such that a selective etch process can remove the material 620 preferentially leaving carbon nanotubes 615 intact and such that exposed carbon nanotubes or carbon nanotube segments 617 can be removed in the presence of dielectric material 620. The undesired dielectric material can be removed, for example, through development of the photodefinable dielectric, through a subtractive etch process for a conventional dielectric material, or an ash for a photoresist material. Resulting patterned regions 620 comprising a dielectric material protectively mask carbon nanotubes 615 that are spanning assembly regions 610. Structure (iv) is then formed by partially or fully removing exposed carbon nanotubes 617 (in which one or no ends are in contact with assembly regions 610), by for example, ashing them away. Ashing to remove exposed carbon nanotubes can be perforated, for example, at a temperature less than 250° C. As mentioned above with respect to FIGS. 1 and 3, in embodiments where d2>>d1 and d3>>d1 additional masking processes shown with respect to Structures (iii) and (iv) of FIG. 6 can be eliminated to reduce manufacturing costs and complexity. Additional elements of the transistor structure, such as sources, drains, and gate regions can be formed using standard semiconductor processing techniques. In embodiments of the invention, the dielectric material 620 remains in the final device structure. In further embodiments of the invention, the dielectric material 620 is photo patternable low-k dielectric material and remains in the final device structure. The dielectric material 620 can also be removed.

Figure 7:
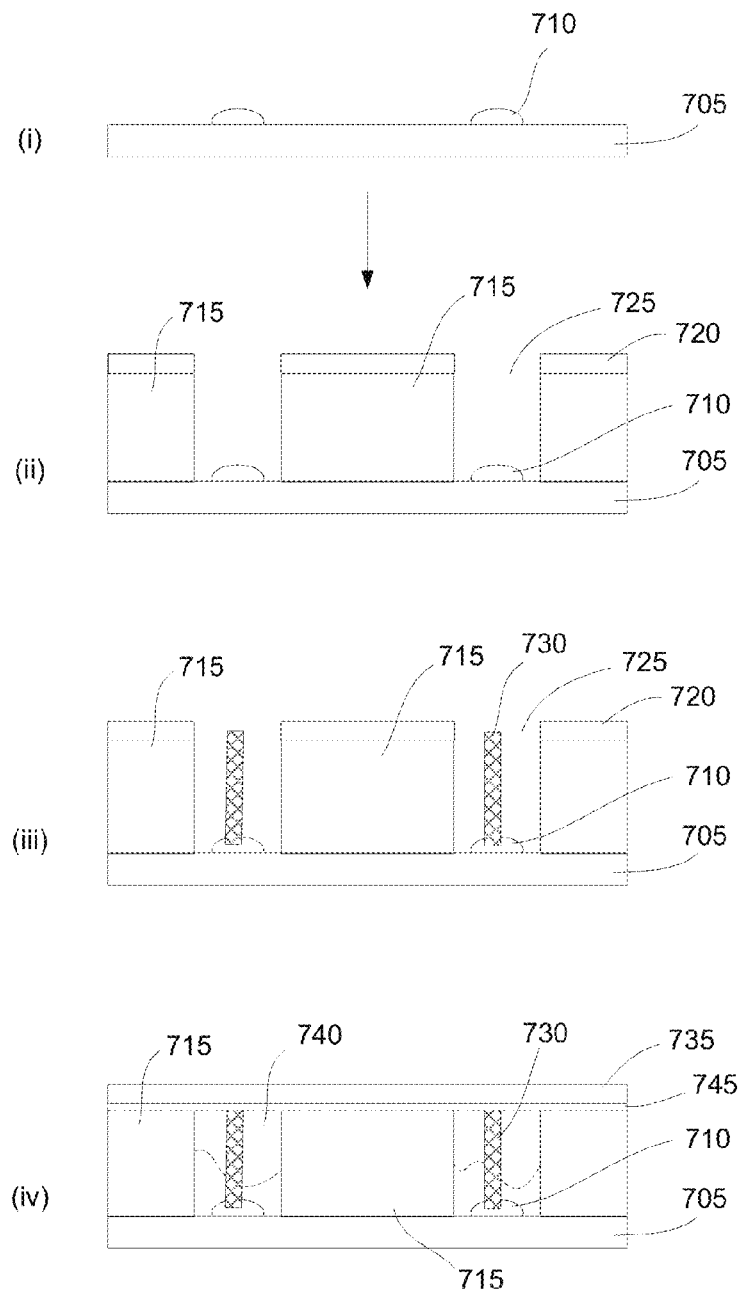
FIG. 7 illustrates a method for the deterministic nanofabrication of interconnect structures.

FIG. 7 illustrates a method for forming an array of contact/via interconnect structures comprising carbon nanotubes. In FIG. 7, Structure (i), a substrate 705 comprises an array of assembly regions 710. The substrate 705 can comprise other vias, lines, interconnects, and/or devices (not shown) in electrical contact with the assembly regions 710 and other devices and/or structures that are part of the monolithic IC chip of which the interconnect structures of FIG. 7 are a part. Assembly regions 710 are capable of attaching to end functionalized carbon nanotubes. In alternate embodiments, the assembly regions 710 can be placed on the substrate 705 after patterning the vias 725 through the dielectric material 715.

Structure (ii) of FIG. 7 is formed by depositing a dielectric material 715 on the substrate and patterning the dielectric material 715 to create vias 725 and trenches 720. The dielectric material 715 can be, for example, a photo patternable dielectric material (either spin-on or CVD) or any other dielectric material that can be patterned and etched. The assembly regions 710 are comprised of a material that is capable of or a material that is chemically functionalized to be capable of causing the assembly regions 710 to direct the attachment of carbon nanotubes 730 to metal region 710 inside vias 725. The assembly regions 710 can be comprised of a metal or mixture of metals, M, such as, for example, gold, silver, copper, cobalt, nickel, palladium, and/or platinum. The carbon nanotubes 730 are chemically end functionalized in a manner that guides assembly of structures comprising carbon nanotubes 730 in via 725. Conducting carbon nanotubes 730 having desired lengths can be prepared using selective growth techniques or post-synthetic separation techniques. Post-synthetic separation techniques include purification techniques such as density gradient ultracentrifugation. Pentagonal and hexagonal defects in single-walled carbon nanotube structures localized primarily on the ends of the tubes can serve as nucleation sites for selective area atomic layer deposition (ALD) of functionalization materials. For example, atomic layer deposition of $Ni_3S_2$, $NiS_2$, and/or $Co_9S_8$ onto the end regions of a carbon nanotube can be used to direct binding of the carbon nanotube ends to assembly regions comprised of late transition metals, such as, Ag, Au, and/or Cu. Atomic layer deposition can deposit a few layers of a material such as $Ni_3S_2$, $NiS_2$, and/or $Co_9S_8$ onto the ends of the carbon nanotubes. Alternately, carbon nanotubes can be selectively end functionalized using vapor phase or solution phase reactions to end functionalize the carbon nanotubes with amine groups. Amine terminated carbon nanotubes can be used to direct binding to the carboxylic acid groups of the polysilicon or doped polysilicon assembly regions. Amine functionalization on the end regions of a carbon nanotube can also be used to direct binding of the carbon nanotube ends to assembly regions comprised of late transition metals. Structure (iii) of FIG. 7 can be formed by, for example, applying end functionalized carbon nanotubes having monodisperse lengths dispersed in a solvent or mixture of solvents to the surface of Structure (ii). Optionally, the solvent or mixture of solvents comprises surfactants. Also, optionally, the solution comprising dispersed end functionalized carbon nanotubes can be agitated to facilitate the fluidic self-assembly process in which the functionalized ends of the carbon nanotubes attach to the assembly regions 710. In embodiments of the invention the carbon nanotubes 730 are a single carbon nanotube or a bundle of carbon nanotubes 730. A bundle of carbon nanotubes can comprise from 2 to 2000 carbon nanotubes. In further embodiments, the carbon nanotubes 730 are metallic and/or single-walled carbon nanotubes. An electrical connection is formed between the carbon nanotube 730 and the metal region 710.

In FIG. 7, Structure (iv) is manufactured by depositing a conducting material 735 into trenches 720. The conducting material 735 is, for example, a metal, such as, copper, aluminum, gold, and/or silver, although other materials are also possible. In embodiments of the invention, the conducting material 735 is copper and the deposition occurs through first depositing a seed layer of copper by, for example PVD, CVD, or ALD, and then through an electrochemical deposition process. Optionally, before the conducting material 735 is deposited, the via 725 is partially or fully filled with a dielectric material 740. The dielectric material 740 can be a spin-on flowable dielectric material, such as, for example, silicon oxide, a carbon-doped oxide (CDO), a fluorocarbon material (CFx), a hydrocarbon material (CHx), a carbosilane material, an oxycarbosilane material, a silicon carbide, or a silicon nitride (any of which may be porous). This material can be polished or edged back to expose the tops of the carbon nanotubes 730. Also optionally, before the conducting material 735 is deposited, and after an optional dielectric material 740 is deposited in the vias 725 and etched back, a metal liner layer 745 can be deposited into trenches 720. The surface of the structure is then chemically/mechanically polished to remove unwanted (overburden) liner layer and/or conducting material from the surface.

In general, carbon nanotubes are fullerene-related structures consisting of cylindrical nanomeric structures of carbon atoms arranged in a hexagonal lattice. Carbon nanotubes can be single-walled or multi-walled (concentric). In embodiments of the invention, the carbon nanotubes are single-walled carbon nanotubes. Carbon nanotubes can be formed, for example, at graphite electrodes during the arc-evaporation of carbon. Single-walled carbon nanotubes can be formed at graphite electrodes containing metals such as cobalt.

Typical dielectric materials used for dielectric layers, features, and/or interlayer dielectrics (ILD) include silicon dioxide, low-k dielectric materials, and photoresists. Additional dielectric materials that may be used include, carbon doped oxides (CDOs), silicon nitrides, silicon oxynitrides, silicon carbides, fluorocarbon (CFx) materials (such as films made from polytetrafluoroethylene, or films formed from PECVD deposition of fluorocarbon precursors (like perfluorocyclobutane) or spin-on fluorocarbon materials), hydrocarbon materials (CHx), fluorosilicate glass (FSG), and/organosilicates such as silsesquioxane, siloxane, or organosilicate glass. Other dielectric materials include photo patternable low-k dielectric materials. Photo patternable materials can have a chemical composition described above, but also either have photoactive groups attached to the backbone to change polarity for solvation or include a photoactive compound (such as, a photo acid generator, photo base generator, photo lewis acid generator, etc.) that, when activated by electromagnetic radiation, enable the backbone material to crosslink into a solid network (negative tone) or cause the backbone to degrade so that it can be washed away (positive tone) The dielectric layer may include pores to further reduce the dielectric constant.

Implementations of the invention are housed on a substrate, such as a semiconductor substrate. Substrate surfaces on which transistor and interconnect structures according to embodiments of the invention can be formed include, for example, H-terminated silicon, silicon dioxide, silicon, silicon germanium, a group III-V (or a group 13-15 in additional periodic table column numbering schemes) compound semiconductor, a main-group oxide, a metal, and/or a binary or mixed metal oxide. The substrate on which implementations of the invention are housed can be part of an IC chip. Layers and layers comprising devices can also be described as the substrate or part of the substrate on which embodiments of the invention are fabricated and housed. The substrate base on which semiconductor devices (IC chips) are built is typically a semiconductor wafer. The base substrate on which an IC chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and/or other group III-V materials either alone or in combination with silicon or silicon dioxide or other insulating materials Devices illustrated herein may comprise additional structures, such as insulating layers enclosing devices, metal trenches and vias connecting sources and drains to other components, and other additional layers and/or devices. Components illustrated as one layer for simplicity, can comprise a plurality of layers of the same or a different material depending, for example, on the manufacturing processes employed in constructing the device and the desired properties of the device.

Figure 8:
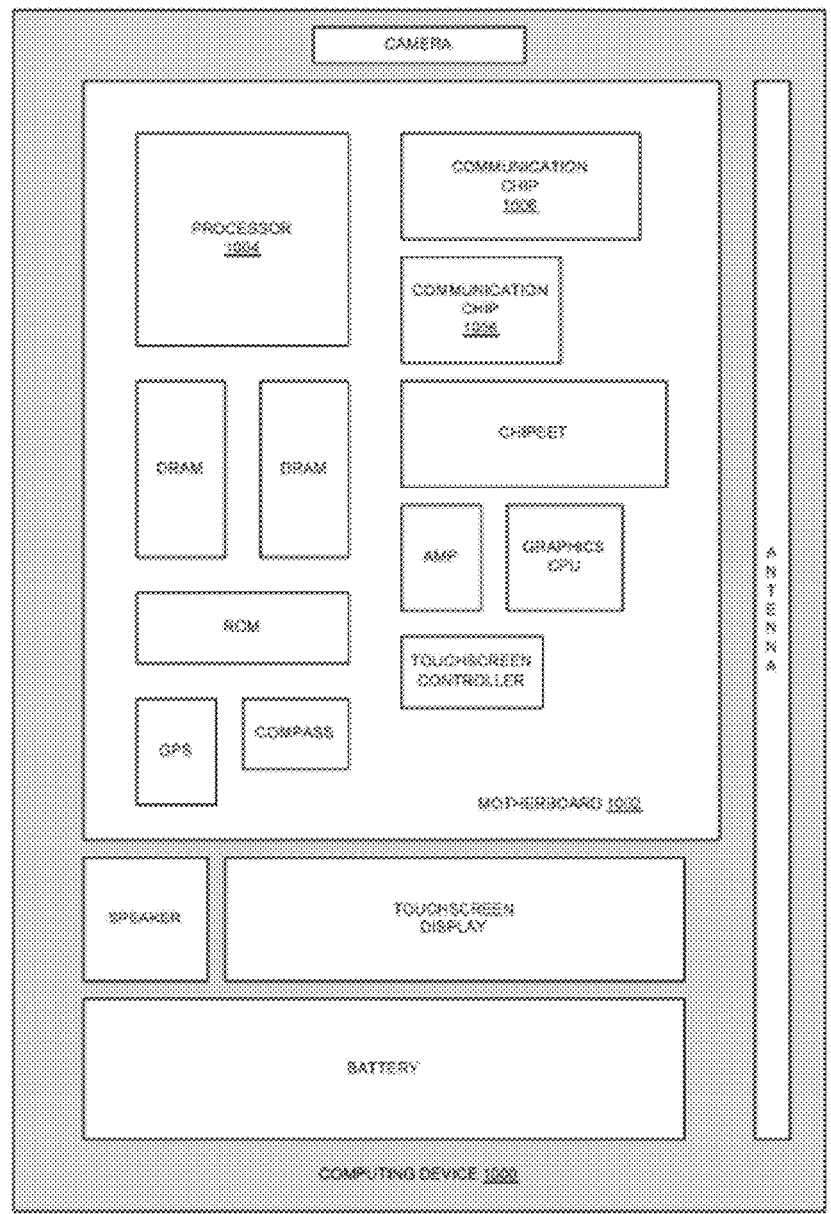
FIG. 8 is a computing device built in accordance with an implementation of the invention.

FIG. 8 illustrates a computing device 1000 in accordance with an implementation of the invention. The computing device 1000 houses a motherboard 1002. The motherboard 1002 may include a number of components, including but not limited to a processor 1004 and at least one communication chip 1006. The processor 1004 is physically and electrically coupled to the motherboard 1002. In some implementations the at least one communication chip 1006 is also physically and electrically coupled to the motherboard 1002.

Depending on its applications, computing device 1000 may include other components that may or may not be physically and electrically coupled to the motherboard 1002. These other components include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors and/or interconnects comprising carbon nanotubes, in accordance with implementations of the invention. Implementations of the invention are useful, for example, for power delivery and signaling functions within the chip. The term "processor" can refer to any device or portion of a device that processes electronic data from registers and/or memory to transform that electronic data into other electronic data that may be stored in registers and/or memory. Cache memory can be located on a same processor chip.

The communication chip 1006 also includes an integrated circuit die packaged within the communication chip 1006. In accordance with another implementation of the invention, the integrated circuit die of the communication chip includes one or more devices, such as transistors or metal interconnects comprising carbon nanotubes, in accordance with implementations of the invention.

In further implementations, another component housed within the computing device 1000 may contain an integrated circuit die that includes one or more devices, such as transistors or metal interconnects comprising carbon nanotubes, in accordance with implementations of the invention.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. Various additional layers and/or structures may be included and/or described features may be omitted in other embodiments.

We claim:

1. A structure comprising,
an array of assembly regions, wherein the array comprises at least two columns of assembly regions, wherein a first and a second column of the at least two columns of assembly regions each comprise at least two assembly regions, wherein the first column of assembly regions is separated from the second column of assembly regions by a first distance, wherein assembly regions within a column are separated from a nearest proximate assembly region by a second distance, and wherein the first distance is not the same as the second distance, at least two carbon nanotubes wherein a first and a second carbon nanotube of the at least two carbon nanotubes have ends, wherein a first end of the first carbon nanotube is in direct contact with a first assembly region of the at least two assembly regions of the first column and a second end of the first carbon nanotube is in direct contact with a second assembly region of the at least two assembly regions of the second column, and wherein a first end of a second carbon nanotube is in direct contact with a third assembly region in the first column and a second end of the second carbon nanotube is in direct contact with a fourth assembly region in the second column, and at least two source regions and at least two drain regions wherein a first source region of the at least two source regions is in contact with the first end of the first carbon nanotube, a second source region of the at least two source regions is in contact with the first end of the second carbon nanotube, a first drain region of the at least two drain regions is in contact with a second end of the first carbon nanotube, and a second drain region of the at least two drain regions is in contact with the second end of the second carbon nanotube.

2. The device of claim 1 wherein the first, second, third and fourth assembly regions comprise polysilicon or doped polysilicon wherein the polysilicon or doped polysilicon comprises carbon, nitrogen, and oxygen.

3. The device of claim 1 wherein the first, second, third and fourth assembly regions comprise a metal and a second substance that is selected from the group consisting of sulfur, nitrogen, and combinations thereof.

4. The device of claim 1 wherein the first, second, third and fourth assembly regions comprise a first metal selected from the group consisting of gold, silver, copper, cobalt, nickel, palladium, platinum, and combinations thereof.

5. The device of claim 4 wherein the first, second, third and fourth assembly regions comprise a second metal that is different from the first metal and selected from the group consisting of nickel and cobalt.

6. The device of claim 1 additionally comprising a first and a second gate dielectric region and a first and second gate electrode region wherein the first gate dielectric region is proximate to the first carbon nanotube, the second gate dielectric region is proximate to the second carbon nanotube, the first gate dielectric regions is between the first carbon nanotube and the first gate electrode region, and the second gate dielectric region is between the second carbon nanotube and the second gate electrode region.

7. The device of claim 1 wherein the at least two carbon nanotubes are single-walled semiconducting carbon nanotubes.

8. The device of claim 1 wherein a gate dielectric material is disposed on the first and the second carbon nanotube and a gate electrode is disposed on the gate dielectric material.

9. The device of claim 1 wherein a photo patternable low-k dielectric material is disposed on the carbon nanotube.

10. A computing device comprising,
a motherboard,
a communication chip mounted on the motherboard, and
a processor mounted on the motherboard, the processor comprising transistors, the transistors comprising:
an array of assembly regions, wherein the array comprises at least two columns of assembly regions, wherein a first and a second column of the at least two columns of assembly regions each comprise at least two assembly regions, wherein the first column of assembly regions is separated from the second column of assembly regions by a first distance, wherein assembly regions within a column are separated from a nearest proximate assembly region by a second distance, and wherein the first distance is not the same as the second distance, at least two carbon nanotubes wherein a first and a second carbon nanotube of the at least two carbon nanotubes have ends, wherein a first end of the first carbon nanotube is in direct contact with a first assembly region of the at least two assembly regions of the first column and a second end of the first carbon nanotube is in direct contact with a second assembly region of the at least two assembly regions of the second column, and wherein a first end of a second carbon nanotube is in direct contact with a third assembly region in the first column and a second end of the second carbon nanotube is in direct contact with a fourth assembly region in the second column, and at least two source regions and at least two drain regions wherein a first source region of the at least two source regions is in contact with the first end of the first carbon nanotube, a second source region of the at least two source regions is in contact with the first end of the second carbon nanotube, a first drain region of the at least two drain regions is in contact with a second end of the first carbon nanotube, and a second drain region of the at least two drain regions is in contact with the second end of the second carbon nanotube, a conducting region in electrical contact with the at least one carbon nanotube disposed at the second end of the via.

11. The device of claim 10 wherein the first, second, third and fourth assembly regions comprise polysilicon or doped polysilicon wherein the polysilicon or doped polysilicon comprises carbon, nitrogen, and oxygen.

12. The device of claim 10 wherein the first, second, third and fourth assembly regions comprise a metal and a second substance that is selected from the group consisting of sulfur, nitrogen, and combinations thereof.

13. The device of claim 10 wherein the first, second, third and fourth assembly regions comprise a first metal selected from the group consisting of gold, silver, copper, cobalt, nickel, palladium, platinum, and combinations thereof.

14. The device of claim 13 wherein the first, second, third and fourth assembly regions comprise a second metal that is different from the first metal and selected from the group consisting of nickel and cobalt.

15. The device of claim 10 additionally comprising a first and a second gate dielectric region and a first and second gate electrode region wherein the first gate dielectric region is proximate to the first carbon nanotube, the second gate dielectric region is proximate to the second carbon nanotube, the first gate dielectric regions is between the first carbon nanotube and the first gate electrode region, and the second gate dielectric region is between the second carbon nanotube and the second gate electrode region.

16. The device of claim 10 wherein the at least two carbon nanotubes are single-walled semiconducting carbon nanotubes.

17. The device of claim 10 wherein a gate dielectric material is disposed on the first and the second carbon nanotube and a gate electrode is disposed on the gate dielectric material.

* * * * *